(12) United States Patent
Lee

(10) Patent No.: US 11,005,076 B2
(45) Date of Patent: May 11, 2021

(54) FLEXIBLE DISPLAY DEVICE

(71) Applicant: Samsung Display Co., Ltd., Yongin-Si (KR)

(72) Inventor: Eonjoo Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/544,880

(22) Filed: Aug. 19, 2019

(65) Prior Publication Data

US 2020/0144550 A1     May 7, 2020

(30) Foreign Application Priority Data

Nov. 5, 2018   (KR) ........................ 10-2018-0134438

(51) Int. Cl.
| | |
|---|---|
| G09G 3/32 | (2016.01) |
| H01L 51/52 | (2006.01) |
| H01L 27/32 | (2006.01) |
| G06F 3/041 | (2006.01) |
| G06F 3/044 | (2006.01) |

(52) U.S. Cl.
CPC ........ H01L 51/5275 (2013.01); G06F 3/0412 (2013.01); G06F 3/0443 (2019.05); G06F 3/0446 (2019.05); H01L 27/322 (2013.01); H01L 27/323 (2013.01); H01L 27/3244 (2013.01); H01L 51/5253 (2013.01); H01L 51/5281 (2013.01); H01L 51/5284 (2013.01); G06F 2203/04102 (2013.01); H01L 2251/5338 (2013.01)

(58) Field of Classification Search
CPC ............ H01L 51/5275; H01L 51/5284; H01L 27/322; H01L 27/323; H01L 51/5281; H01L 27/3244; H01L 51/5253; H01L 2251/5338; G06F 3/0412; G06F 3/0446; G06F 3/0443; G06F 2203/04102; G06F 2203/04111
See application file for complete search history.

(56) References Cited

U.S. PATENT DOCUMENTS

| | | |
|---|---|---|
| 9,356,083 B2 | 5/2016 | Kang et al. |
| 9,368,756 B2 | 6/2016 | Satoh et al. |
| 10,008,555 B2 | 6/2018 | Yoo et al. |
| 2015/0048333 A1 | 2/2015 | Choi et al. |

(Continued)

FOREIGN PATENT DOCUMENTS

| | | |
|---|---|---|
| KR | 10-2014-0048796 A | 4/2014 |
| KR | 10-2014-0088408 A | 7/2014 |

(Continued)

*Primary Examiner* — Adam R. Giesy
(74) *Attorney, Agent, or Firm* — Innovation Counsel LLP

(57) ABSTRACT

A flexible display device includes a substrate including a light-emitting diode having an emissive layer arranged in a light-emitting area of each of sub-pixels; a thin-film encapsulation layer covering the light-emitting diode; a black matrix arranged in a peripheral area of the sub-pixels and including a plurality of first openings respectively corresponding to light-emitting areas; a color filter layer including a plurality of color filters in each of the plurality of first openings; a low refractive layer arranged on the color filter layer; and a high refractive layer arranged on the low refractive layer and having a refractive index higher than a refractive index of the low refractive layer.

20 Claims, 9 Drawing Sheets

(56) References Cited

U.S. PATENT DOCUMENTS

2018/0062116 A1    3/2018  Park et al.
2018/0160552 A1*   6/2018  Choi .................. H01L 51/5268
2018/0261738 A1    9/2018  Cha et al.

FOREIGN PATENT DOCUMENTS

| KR | 10-2015-0019325 A | 2/2015 |
| KR | 10-1695652 B1 | 1/2017 |
| KR | 10-2017-0125438 A | 11/2017 |
| KR | 10-2018-0025027 A | 3/2018 |
| KR | 10-1881066 B1 | 7/2018 |

* cited by examiner

FLEXIBLE DISPLAY DEVICE

CROSS-REFERENCE TO RELATED APPLICATION

This application claims the benefit of Korean Patent Application No. 10-2018-0134438, filed on Nov. 5, 2018, in the Korean Intellectual Property Office, the disclosure of which is incorporated herein in its entirety by reference.

BACKGROUND

1. Field

One or more embodiments relate to a flexible display device.

2. Description of the Related Art

Generally, a display device may be used in a mobile apparatus such as a smartphone, a laptop computer, a digital camera, a camcorder, a personal digital assistant, a notebook computer, a tablet personal computer, or an electronic apparatus such as a desktop computer, a television, an outdoor billboard, a display device for exhibitions, a vehicle dashboard, or a head-up display (HUD).

Recently, slimmer display devices have been developed and released.

Flexible display devices are easy to carry and may be included in apparatuses having various shapes. Among those, a flexible display device based on organic light-emitting display technology is one of the most attractive flexible display devices. The flexible display device may be bent without breaking.

In the flexible display device, colors may be viewed differently depending on viewing angles. For example, when a white color lights up, a panel may display a white color from a front surface of the panel, but display a bluish color according to a viewing angle. Accordingly, color characteristics of the flexible display device may be worsened.

SUMMARY

One or more embodiments include a flexible display device in which light characteristics are enhanced.

Additional aspects will be set forth in part in the description which follows and, in part, will be apparent from the description, or may be learned by practice of the presented embodiments.

According to one or more embodiments, a flexible display device includes a substrate on which a plurality of sub-pixels are arranged and which includes a light-emitting diode having an emissive layer arranged in a light-emitting area of each of the plurality of sub-pixels; a thin-film encapsulation layer covering the light-emitting diode; a black matrix arranged in a peripheral area of the plurality of sub-pixels and including a plurality of first openings respectively corresponding to light-emitting areas; a color filter layer including a plurality of color filters in each of the plurality of first openings; a low refractive layer arranged on the color filter layer; and a high refractive layer arranged on the low refractive layer and having a refractive index higher than a refractive index of the low refractive layer.

The low refractive layer may include a plurality of second openings respectively corresponding to the light-emitting areas.

The low refractive layer may include a first surface facing the thin-film encapsulation layer and a second surface arranged in a position opposite to the thin-film encapsulation layer with reference to the first surface, and a size of a second opening in the first surface may be different from a size of a second opening in the second surface.

The low refractive layer may include an organic material having a refractive index of 1.2 to 1.3.

The high refractive layer may cover the low refractive layer and fill the plurality of second openings.

The high refractive layer may include a first surface facing the thin-film encapsulation layer and a second surface arranged in a position opposite to the thin-film encapsulation layer with reference to the first surface, and the second surface may include an uneven portion.

The uneven portion may be arranged to fill a second opening corresponding to each of the light-emitting areas.

In a plan view, the uneven portion may include a shape selected from a dot type, a stripe type, a ring type, a rectangular type, a round type, an oval type, a wavy type, and a band type.

The high refractive layer may include a first surface facing the thin-film encapsulation layer and a second surface arranged in a position opposite to the thin-film encapsulation layer with reference to the first surface, and the second surface may include a flat surface.

The high refractive layer may include an organic material having a refractive index of 1.5 or greater.

A touch sensing unit may be further arranged on the thin-film encapsulation layer, and the touch sensing unit may include a plurality of first electrode patterns patterned on the thin-film encapsulation layer; a plurality of second electrode patterns crossing the plurality of first electrode patterns; and an insulating layer configured to insulate the plurality of first electrode patterns from the plurality of second electrode patterns.

According to one or more embodiments, a flexible display device includes a substrate including a first display area in a first direction and a second display area bent in a second direction crossing the first direction; a light-emitting diode including an emissive in a light-emitting area of each of sub-pixels of the first display area and the second display area; a thin-film encapsulation layer covering the light-emitting diode; a black matrix arranged in a peripheral area of the sub-pixels and including a plurality of first openings respectively corresponding to light-emitting areas; a color filter layer including a plurality of color filters in each of the plurality of first openings; a low refractive layer arranged on the color filter layer; and a high refractive layer arranged on the low refractive layer and having a refractive index higher than a refractive index of the low refractive layer.

The low refractive layer may include a plurality of second openings respectively corresponding to the light-emitting areas.

The high refractive layer may cover the low refractive layer and fill the plurality of second openings.

The high refractive layer in the first display area may include a first surface facing the thin-film encapsulation layer and a second surface arranged in a position opposite to the thin-film encapsulation layer with reference to the first surface, and the second surface may have a flat surface.

The high refractive layer in the second display area may include a first surface facing the thin-film encapsulation layer and a second surface arranged in a position opposite to the thin-film encapsulation layer with reference to the first surface, and the second surface may have as an uneven portion.

The uneven portion may be arranged to fill a second opening corresponding to each of the light-emitting areas.

According to one or more embodiments, a flexible display device includes a substrate on which a plurality of sub-pixels are arranged and which includes a light-emitting diode having an emissive layer arranged in a light-emitting area of each of the plurality of sub-pixels; a thin-film encapsulation layer covering the light-emitting diode; a low refractive layer arranged on the thin-film encapsulation layer and including a plurality of openings respectively corresponding to the light-emitting areas; a high refractive layer arranged on the low refractive layer and having a refractive index higher than a refractive index of the low refractive layer; and a polarization layer arranged on the high refractive layer and covering the high refractive layer.

The high refractive layer may cover the low refractive layer and fill the plurality of openings.

The high refractive layer may include a first surface facing the thin-film encapsulation layer and a second surface arranged in a position opposite to the thin-film encapsulation layer with reference to the first surface, and the second surface may include an uneven portion in the refractive layer filling the plurality of openings respectively corresponding to the light-emitting areas.

In addition to those described above, other aspects, features and effects will become apparent from the following drawings, claims, and detailed descriptions of the present disclosure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
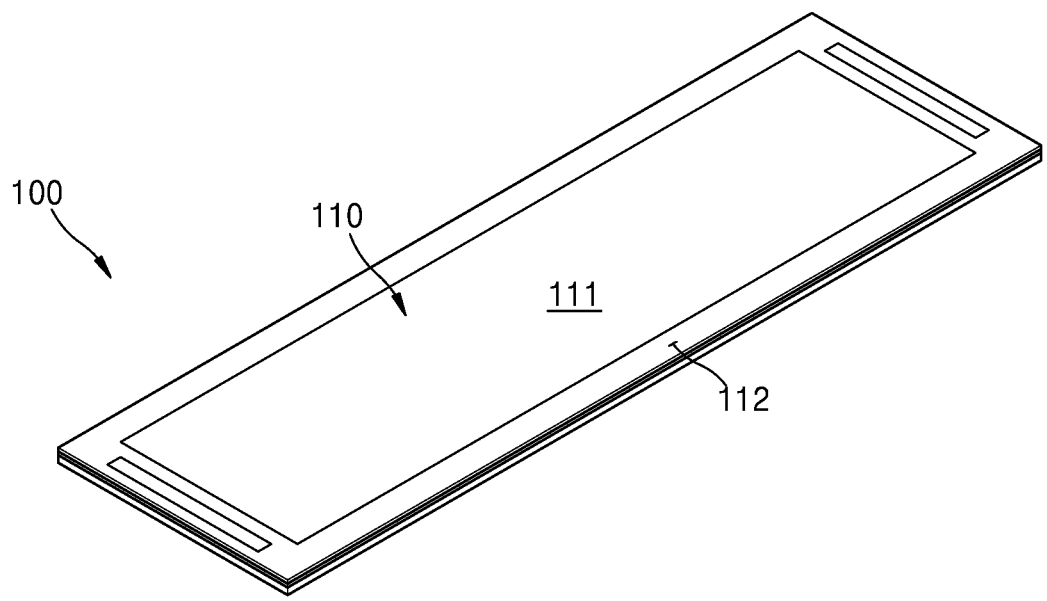
FIG. 1 is a perspective view illustrating a state in which a flexible display device is unrolled according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of, " when preceding a list of elements, modify the entire list of elements and do not modify the individual elements of the list.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein.

It will be understood that when a component, such as a layer, a film, region, or a plate is referred to as being "on," another component, the component can be directly on the other component or intervening components may be present. In addition, sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, exemplary embodiments of a flexible display device will be described in detail with reference to the attached drawings. Like reference numerals in the drawings denote like elements, and thus their descriptions will not be repeated.

Figure 2:
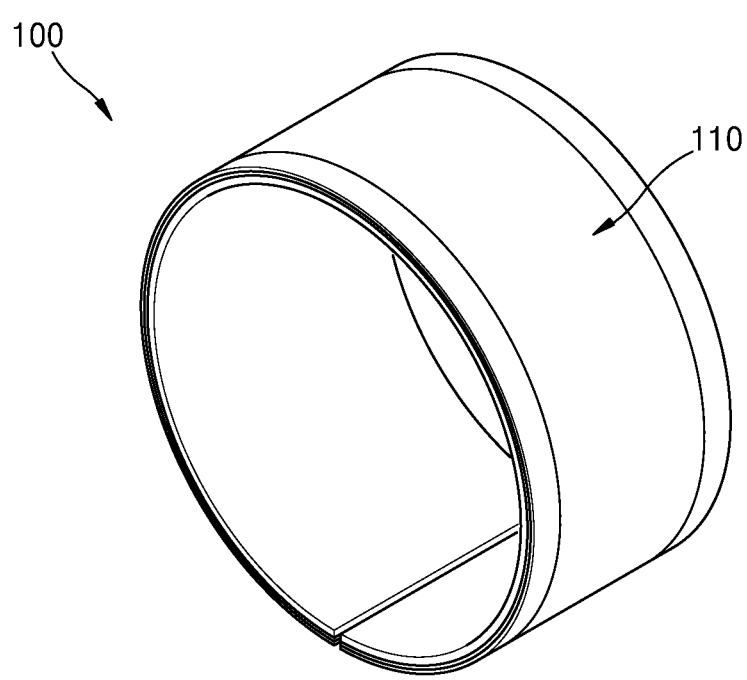
FIG. 2 illustrates a state in which the flexible display device of FIG. 1 is rolled.

FIG. 1 is a perspective view illustrating a state in which a flexible display device 100 is unrolled according to an embodiment. FIG. 2 is a perspective view illustrating a state in which the flexible display device 100 of FIG. 1 is rolled.

Referring to FIGS. 1 and 2, the flexible display device 100 includes a display panel 110. The display panel 110 may include a flexible film. The display panel 110 includes a display area 111 displaying an image and a non-display area 112 outside of the display area 111. In a non-limiting example, the non-display area 112 surrounds the display area 111.

The flexible display device 100 may include various functional layers such as a support layer, a touch sensing unit, a polarizing layer, etc., in addition to the display panel 110 that is flexible. An image may be viewed from the flexible display device 100 at various angles such as when the flexible display device 100 is unrolled, rolled, or curved, etc.

Figure 3:
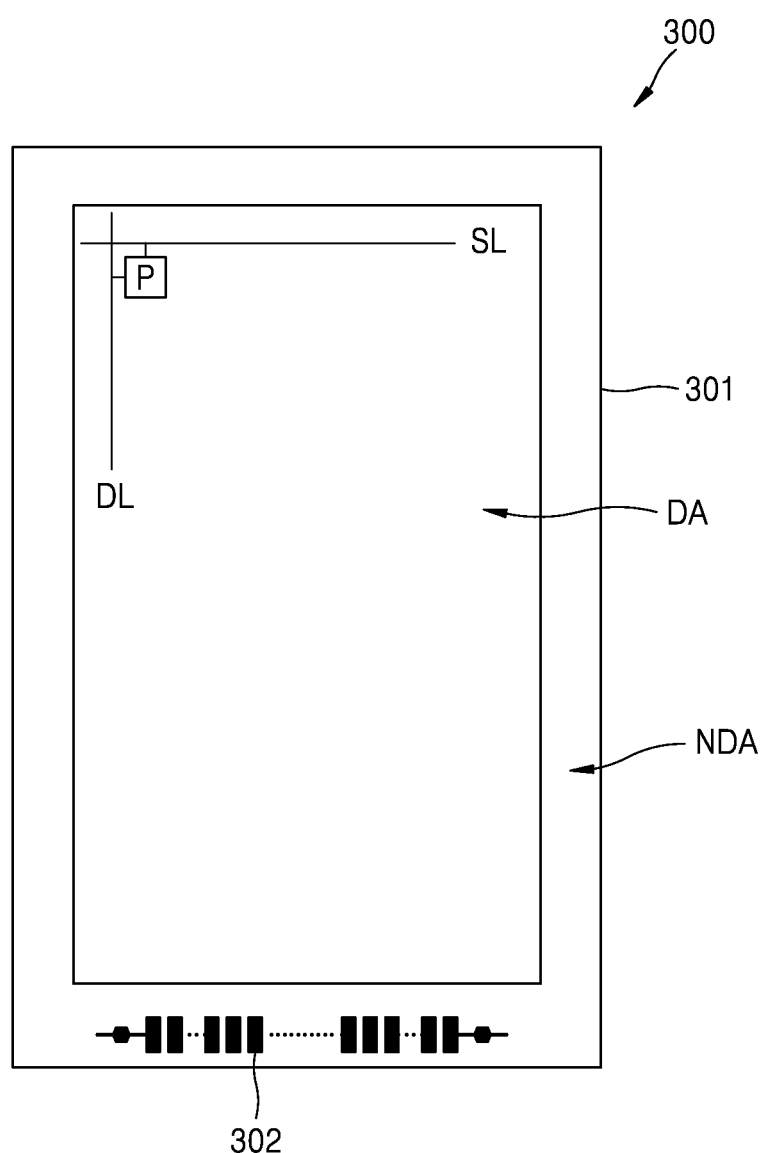
FIG. 3 is a plan view of the flexible display device according to an embodiment.

FIG. 3 illustrates a flexible display device 300 according to an embodiment.

Referring to the drawing, the flexible display device 300 includes a substrate 301. The substrate 301 may include a flexible substrate, for example, a flexible film. The substrate 301 may be transparent, opaque, or translucent.

On the substrate 301, a display area DA displaying an image and a non-display area NDA extending to the outside of the display area DA may be arranged. In the display area DA, a plurality of pixels P may be arranged. Each of the plurality of pixels P may be arranged in an area in which a data line DL crosses a scan line SL. In the non-display area NDA, a power line (not shown) supplying power to devices may be arranged. In the non-display area NDA, a pad 302 supplying an electrical signal from a power-supply device (not shown) or a signal generating device (not shown) to the display area DA may be arranged.

Figure 4:
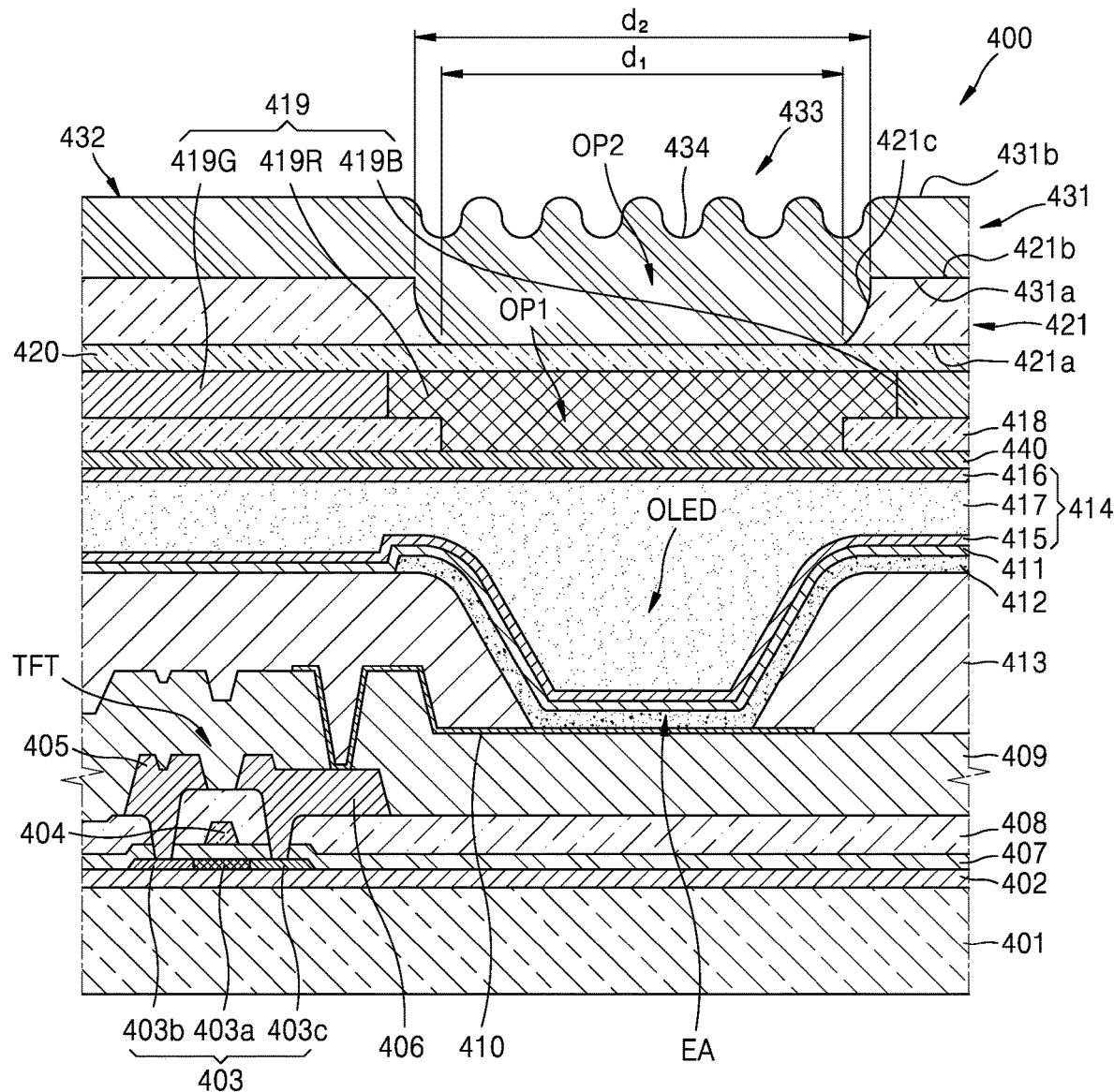
FIG. 4 is an expanded cross-sectional view of a sub-pixel of the flexible display device according to an embodiment.

FIG. 4 illustrates a sub-pixel of a flexible display device 400 according to an embodiment.

Here, the flexible display device 400 may be an organic light-emitting display device. Sub-pixels include at least one thin-film transistor TFT and an organic light-emitting diode OLED. The at least one of thin-film transistor TFT is not limited to the structure shown in FIG. 4, and a number and a structure of the at least one of thin-film transistor TFT may be variously modified. According to an embodiment, the flexible display device 400 may be a liquid-crystal display device, a field emission display device, or an electronic paper display device, but is not limited thereto.

Referring to the drawing, the flexible display device 400 includes a substrate 401. The substrate 401 may include a flexible substrate. The substrate 401 may include a flexible film.

On the substrate 401, a barrier layer 402 may be arranged. The barrier layer 402 may be arranged directly on the substrate 401. The barrier layer 402 includes an inorganic material.

Over the substrate 401, the at least one thin-film transistor TFT and the organic light-emitting diode OLED electrically connected to the at least one thin-film transistor TFT may be arranged.

The at least one thin-film transistor TFT includes a semiconductor layer 403, a gate electrode 404, a source electrode 405, and a drain electrode 406. The at least one thin-film transistor TFT may be a top-gate type thin-film transistor in which the semiconductor layer 403, the gate electrode 404, the source electrode 405, and the drain electrode 406 are sequentially stacked. However, various types of thin-film transistors TFT such as a bottom-gate type thin-film transistor may be applied to the current embodiment.

The semiconductor layer 403 includes a channel area 403a, and a source area 403b and a drain area 403c arranged at both sides of the channel area 403a, respectively. The source area 403b and the drain area 403c may be doped with an N-type impurity ion or a P-type impurity ion. The source area 403b may be electrically connected to the source electrode 405. The drain area 403c may be electrically connected to the drain electrode 406.

The semiconductor layer 403 includes a semiconductor material such as amorphous silicon, polycrystalline silicon, or the like. However, the semiconductor layer 403 is not limited thereto, and may include various materials. For example, the semiconductor layer 403 includes an organic semiconductor material or an oxide semiconductor material.

On the semiconductor layer 403, a gate insulating layer 407 may be arranged. The gate insulating layer 407 may cover the semiconductor layer 403. The gate insulating layer 407 includes an inorganic material. For example, the gate insulating layer 407 includes a silicon oxide and/or a silicon nitride. The gate insulating layer 407 may include a single layer or multiple layers. The gate insulating layer 407 may insulate the semiconductor layer 403 from the gate electrode 404.

The gate electrode 404 may be arranged on the gate insulating layer 407. The gate electrode 404 may be connected to a gate line (not shown) applying an on/off signal to the at least one thin-film transistor TFT.

The gate electrode 404 includes a low-resistance metal material. For example, the gate electrode 404 includes one or more materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 404 may include a single layer or multiple layers.

On the gate electrode 404, an interlayer insulating layer 408 may be arranged. The interlayer insulating layer 408 may cover the gate electrode 404. The interlayer insulating layer 408 includes an inorganic material. For example, the interlayer insulating layer 408 includes a silicon oxide and/or a silicon nitride. The interlayer insulating layer 408 may include a single layer or multiple layers. The interlayer insulating layer 408 may insulate the gate electrode 404 from the source electrode 405 and the drain electrode 406.

On the interlayer insulating layer 408, the source electrode 405 and the drain electrode 406 may be arranged. The source electrode 405 and the drain electrode 406 may be in contact with the source area 403b and the drain area 403c, respectively. The source electrode 405 and the drain electrode 406 include a metal material. For example, the source electrode 405 and the drain electrode 406 may include one or more materials selected from Al, Pt, Pd, Ag, Mg, Au, Ni, Nd, Ir, Cr, Li, Ca, Mo, Ti, W, and Cu. The source electrode 405 and the drain electrode 406 may include a single layer or multiple layers. For example, the source electrode 405 and the drain electrode 406 may have a structure in which three layers respectively including Ti, Al, and Ti are stacked.

On the at least one thin-film transistor TFT, a protective layer 409 may be arranged. The protective layer 409 may cover the source electrode 405 and the drain electrode 406. The protective layer 409 includes at least one of a passivation layer or a planarization layer. The protective layer 409 may include a single layer or multiple layers. The protective layer 409 includes an organic material. For example, the protective layer 409 includes a general-purpose polymer such as polymethyl methacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a mixture thereof. According to another embodiment, the protective layer 409 may have a structure in which an inorganic insulating layer and an organic insulating layer are stacked.

Over the protective layer 409, the organic light-emitting diode OLED may be arranged. The organic light-emitting diode OLED includes a pixel electrode 410, an opposite electrode 411, and an emissive layer 412 therebetween.

The pixel electrode 410 is arranged on the protective layer 409, and may be electrically connected to the at least one thin-film transistor TFT. The pixel electrode 410 may have various forms. For example, the pixel electrode 410 may be patterned in an island type.

The pixel electrode 410 may function as an anode. The pixel electrode 410 may include a reflective electrode. For example, the pixel electrode 410 includes a reflective layer including Ag, Mg, Al, Pt, Pd, Au, Ni, Nd, Ir, Cr, or a compound thereof, and a transparent or a translucent electrode on the reflective layer. The transparent electrode or the translucent electrode may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 411 may function as a cathode. The opposite electrode 411 may include a transparent electrode or a translucent electrode. For example, the opposite electrode 411 may be a thin metal film including Li, Ca, lithium-fluoride-calcium (LiF/Ca), lithium-fluoride-aluminum (LiF/Al), Al, Ag, Mg, or a compound thereof and having a low work function. In another embodiment, the opposite electrode 411 may include a thin metal film on which an auxiliary electrode or a bus electrode is arranged by using a material of a transparent electrode, such as ITO, IZO, ZnO, In$_2$O$_3$, or the like. Accordingly, the opposite electrode 411 may transmit light emitted from the emissive layer 412. The light emitted from the emissive layer 412 is reflected by the pixel electrode 410 toward the opposite electrode 411.

However, according to the current embodiment, the flexible display device 400 is not limited to a top-emission type. The flexible display device 400 may be a bottom-emission type in which light emitted from the emissive layer 412 is radiated toward the substrate 401. In this case, the pixel electrode 410 may include a transparent electrode or a translucent electrode, and the opposite electrode 411 may include a reflective electrode. In addition, according to the current embodiment, the flexible display device 400 may be a dual-emission type display device in which light is emitted in both front and rear directions.

On the pixel electrode 410, a pixel-defining layer 413 may be arranged. The pixel-defining layer 413 may define a light-emitting area EA of each of the sub-pixels by surrounding an edge of the pixel electrode 410. The pixel-defining layer 413 includes an organic material. For example, the pixel-defining layer 413 includes at least one organic material selected from the group consisting of polyimide, polyamide, acrylic resin, benzocyclobutene, and a phenol resin. The pixel-defining layer 413 exposes a certain area of the pixel electrode 410. The emissive layer 412 may be arranged in the exposed area of the pixel electrode 410.

The emissive layer 412 includes a low-molecular weight organic material or a polymer organic material. The organic light-emitting diode OLED selectively further includes a functional layer such as a hole transport layer (HTL), a hole injection layer (HIL), an electron transport layer (ETL), an electron injection layer (EIL), etc., in addition to the emissive layer 412.

A thin-film encapsulation layer 414 may cover the organic light-emitting diode OLED. The thin-film encapsulation layer 414 may prevent external oxygen or moisture from penetrating into a display displaying an image by sealing the display. The thin-film encapsulation layer 414 may include at least one layer selected from first and second inorganic layers 415 and 416, and at least one organic layer 417. In the thin-film encapsulation layer 414, the first inorganic layer 415, the at least one organic layer 417, and the second inorganic layer 416 may be stacked. In an embodiment, the thin-film encapsulation layer 414 may further include a plurality of inorganic layers and a plurality of organic layers stacked alternately. A number of times the plurality of inorganic layers and the plurality of organic layers are stacked is not limited.

The first inorganic layer 415 and the second inorganic layer 416 each include an inorganic layer. For example, the first inorganic layer 415 and the second inorganic layer 416 each include at least one material selected from the group consisting of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride.

The at least one organic layer 417 includes an organic material. For example, the at least one organic layer 417 includes at least one material selected from the group consisting of acrylic-based resin, meth acrylic-based resin, polyisoprene, vinyl-based resin, epoxy-based resin, urethane-based resin, cellulose-based resin, and perylene-based resin.

Figure 5:
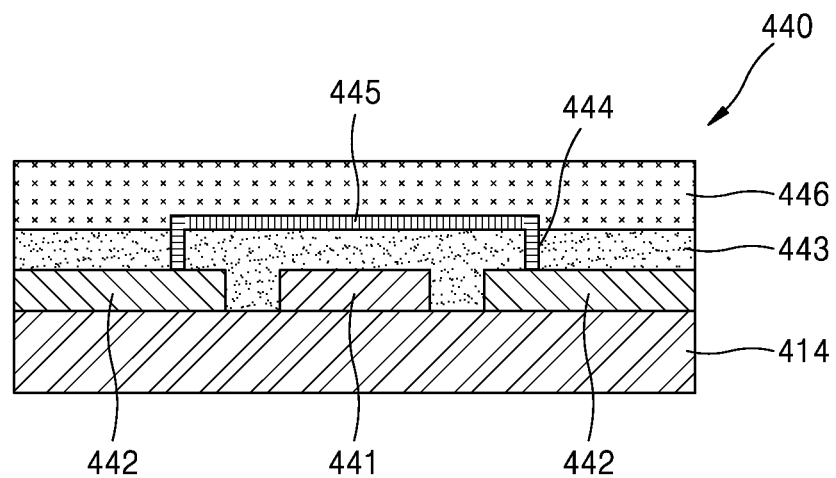
FIG. 5 is a cross-sectional view of a touch sensing unit of FIG. 4.

On the thin-film encapsulation layer 414, a touch sensing unit 440 may be arranged. Referring to FIG. 5, the touch sensing unit 440 may include an on-cell touch screen panel in which a touch screen pattern is arranged on the thin-film encapsulation layer 414. The touch sensing unit 440 may be formed integrally with the thin-film encapsulation layer 414. However, the touch sensing unit 440 is not limited thereto. In an embodiment, the touch sensing unit 440 may include a touch sensing unit of an electrostatic capacitive type, but is not limited thereto.

The touch sensing unit 440 includes a plurality of first electrode patterns 441 and a plurality of second electrode patterns 442, both patterned on the thin-film encapsulation layer 414. The plurality of first electrode patterns 441 and the plurality of second electrode patterns 442 may be arranged in directions crossing each other. In an embodiment, the plurality of first electrode patterns 441 and the plurality of second electrode patterns 442 may be patterned on a touch substrate additionally provided.

An insulating layer 443 may be arranged on the plurality of first electrode patterns 441 and the plurality of second electrode patterns 442. The insulating layer 443 may cover the plurality of first electrode patterns 441 and the plurality of second electrode patterns 442. The plurality of second electrode patterns 442 neighboring each other may be connected to each other by using a connector 445 arranged via a contact hole 444. Although not illustrated, the plurality of first electrode patterns 441 neighboring each other may be connected to each other by using an additional connector. In an embodiment, the plurality of first electrode patterns 441 and the plurality of second electrode patterns 442 may be arranged on a same layer. However, the plurality of first electrode patterns 441 and the plurality of second electrode patterns 442 may be arranged on different layers.

A protective layer 446 may be arranged on the insulating layer 443.

When an input object such as a finger or a stylus pen approaches or contacts the flexible display device 400 (shown in FIG. 4), the touch sensing unit 440 may detect a touch location by measuring a capacitance change between the plurality of first electrode patterns 441 and the plurality of second electrode patterns 442.

Referring back to FIG. 4, a black matrix 418 may be arranged on the touch sensing unit 440. The black matrix 418 may be arranged in a non-light-emitting area that is a peripheral area of the sub-pixels surrounding the light-emitting area EA. In the black matrix 418, a plurality of first openings OP1 may be arranged. The plurality of first openings OP1 may be arranged in light-emitting areas EA, respectively. The emissive layer 412 in the light-emitting area EA may be exposed through the plurality of first openings OP1.

A color filter layer 419 may be arranged in the light-emitting area EA defined by the black matrix 418. The color filter layer 419 includes a plurality of color filters having different ranges of a transmission wavelength. For example, the color filter layer 419 includes a red color filter 419R, a green color filter 419G, and a blue color filter 419B emitting red light, green light, and blue light, respectively. The red color filter 419R, the green color filter 419G, and the blue color filter 419B may be each arranged in the plurality of first openings OP1. More specifically, the green color filter 419G and the blue color filter 419B are each arranged in the first openings OP1 of adjacent other sub-pixels. That is, the red color filter 419R, the green color filter 419G, and the blue color filter 419B may be arranged in the light-emitting area EA of each of the sub-pixels defined by the pixel-defining layer 413. The black matrix 418 may prevent colors of light emitted by the red color filter 419R, the green color filter 419G, and the blue color filter 419B, respectively, from being mixed, and may also obstruct light incident from outside.

As the black matrix 418 and the color filter layer 419 are arranged in the flexible display device 400, light efficiency and color gamut may be enhanced, power consumption may be reduced, and flexibility may increase. When the flexible display device 400 includes the black matrix 418 and the color filter layer 419, a polarizer may not be needed.

On the black matrix 418 and the color filter layer 419, an over-coating layer 420 may be arranged. The over-coating layer 420 may protect the color filter layer 419 and planarize an upper surface of the color filter layer 419. In an embodiment, the over-coating layer 420 may not be included.

Over the over-coating layer 420, a low refractive layer 421 and a high refractive layer 431 having different refractive indices may be arranged. The low refractive layer 421 may be arranged on the over-coating layer 420 and the high refractive layer 431 may be arranged on the low refractive layer 421. The high refractive layer 431 and the low refractive layer 421 may be arranged to enhance light output efficiency by controlling an optical path.

The low refractive layer 421 may cover the over-coating layer 420. The low refractive layer 421 includes a first surface 421a facing the thin-film encapsulation layer 414 and a second surface 421b arranged in a position opposite to the thin-film encapsulation layer 414 with reference to the first surface 421a.

The low refractive layer 421 includes a plurality of second openings OP2 corresponding to the light-emitting areas EA, respectively. A size $d_1$ of each of the plurality of second openings OP2 in the first surface 421a of the low refractive layer 421 may be different from a size $d_2$ of each of the plurality of second openings OP2 in the second surface 421b of the low refractive layer 421. In the plurality of second openings OP2, the first surface 421a may be connected to the second surface 421b by a slope 421c.

The low refractive layer 421 includes an organic material having a refractive index of about 1.2 to about 1.3. For example, the low refractive layer 421 includes an imide-based polymer, a general-purpose polymer such as PMMA or PS, a polymer derivative containing a phenol group, an acrylic-based polymer, an aryl ether-based polymer, an amide-based polymer, a fluorine-based polymer, a p-xylene-based polymer, a vinyl alcohol-based polymer, or a mixture thereof.

The high refractive layer 431 may cover the second surface 421b of the low refractive layer 421. In addition, the high refractive layer 431 may fill the plurality of second openings OP2. The high refractive layer 431 includes a first surface 431a facing the thin-film encapsulation layer 414, and a second surface 431b arranged in a position opposite to the thin-film encapsulation layer 414 with reference to the first surface 431a. The first surface 431a of the high refractive layer 431 may contact the second surface 421b of the low refractive layer 421.

The high refractive layer 431 may have a refractive index higher than that of the low refractive layer 421. The high refractive layer 431 includes an organic material having a refractive index of about 1.5 or greater. For example, the high refractive layer 431 includes acrylate, a (meth)acrylate-based polymer, an acetylene-based polymer, etc. In an embodiment, although the high refractive layer 431 includes an organic material having a refractive index higher than that of the low refractive layer 421, the high refractive layer 431 is not limited to thereto.

Since the size $d_1$ of each of the plurality of the second openings OP2 in the first surface 421a of the low refractive layer 421 is different from the size $d_2$ of each of the plurality of the second openings OP2 in the second surface 421b of the low refractive layer 421, the thickness of the central portion of the plurality of second openings OP2 may be different from that of the edge portion of the plurality of second opening OP2. Accordingly, the plurality of second openings OP2 may function as a round lens.

Since the low refractive layer 421 and the high refractive layer 431 are stacked in the respective light-emitting areas EA, light lost from the inside of a panel due to refraction in a lens may be easily extracted. Accordingly, the light extraction efficiency of the organic light-emitting diode OLED may be enhanced.

In the flexible display device 400, although light efficiency on a front surface of the panel may be enhanced due to the presence of the low refractive layer 421 and the high refractive layer 431, color change characteristics according to a viewing angle from a side surface of the panel, that is, white angular dependency (WAD), may deteriorate. The WAD refers to a color shift occurring at a side viewing angle.

To reduce the WAD, an uneven portion 434 may be arranged on the high refractive layer 431. In detail, the high refractive layer 431 includes a flat portion 432. The flat portion 432 may cover the second surface 421b of the low refractive layer 421 in non-light-emitting areas other than the respective light-emitting areas EA. A thickness between the first surface 431a and the second surface 431b of the high refractive layer 431 in the flat portion 432 may be uniform.

The uneven portion 434 may be arranged in a portion 433 of the high refractive layer 431 filling the plurality of second openings OP2 corresponding to the light-emitting areas EA, respectively. The uneven portion 434 may be arranged on the second surface 431b of the high refractive layer 131. The uneven portion 434 may be a protrusion with a hemispheric shape, and/or a plurality of protrusions each with a hemispheric shape that may be regularly spaced apart from each other. The high refractive layer 431 including the uneven portion 434 may be patterned through a photolithography process. While light emitted from the organic light-emitting diode OLED passes through the uneven portion 434, the light may generate diffused reflection. The WAD may be reduced according to the diffused reflection in the uneven portion 434. In addition, a reflective color strip that may be generated due to the presence of the black matrix 418 and the color filter layer 419 may be removed.

As such, as the light emitted from the organic light-emitting diode OLED passes through the low refractive layer 421 and the high refractive layer 431 having different refractive indices, light efficiency on a front surface of the panel is enhanced. Then, as the light passes through the uneven portion 434, the WAD may be reduced or resolved.

The uneven portion 434 may include a protrusion having a hemispheric shape as an example. However, although the uneven portion 434 includes a protruding shape, the uneven portion 434 is not limited to thereto. For example, in a plan view, the uneven portion 434 may have various types of shapes such as a dotted type, a striped type, a ring type, a polygonal type, a round type, an oval type, a wavy type, a band type, and a rectangular type etc.

Figure 6A:
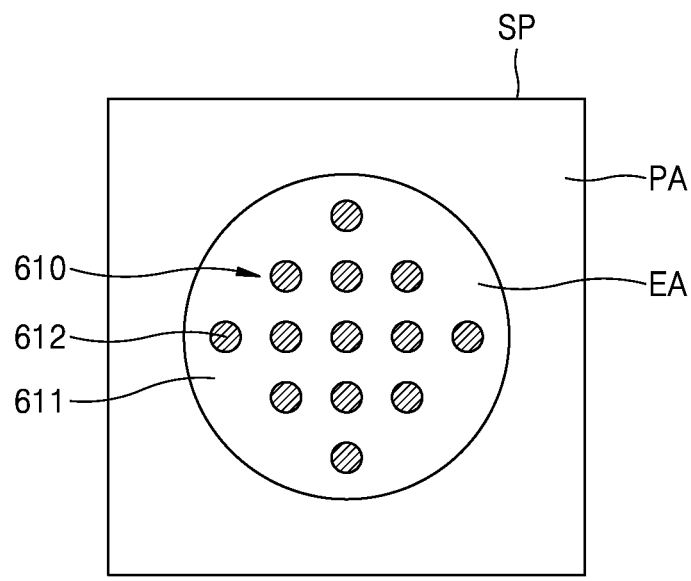
FIGS. 6A, 6B and 6C are plan views of an uneven portion of a high refractive layer according to an embodiment.

Referring to FIG. 6A, a sub-pixel SP includes the light-emitting area EA and a peripheral area PA surrounding the light-emitting area EA. In the sub-pixel SP, a high refractive layer 611 may be arranged. In the light-emitting area EA, an uneven portion 610 may be arranged on the high refractive layer 611. The uneven portion 610 includes a plurality of dots 612. The plurality of dots 612 may be spaced apart from each other.

Figure 6B:
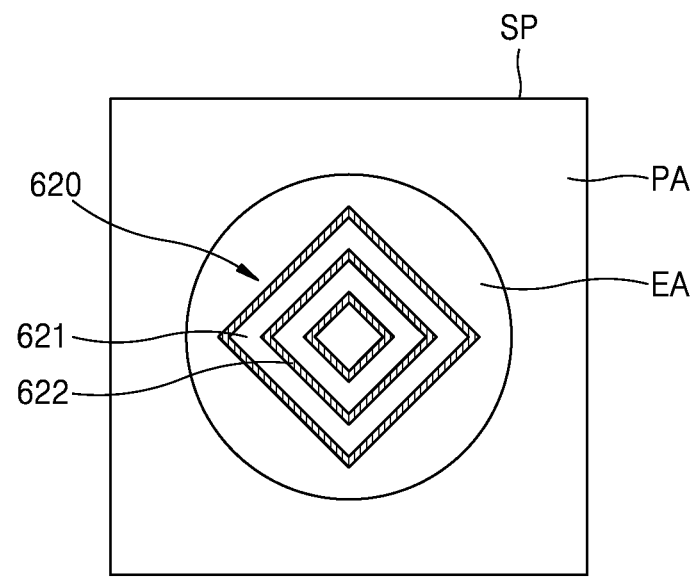

Referring to FIG. 6B, in the sub-pixel SP, a high refractive layer 621 may be arranged. In the light-emitting area EA, an uneven portion 620 may be arranged on the high refractive layer 621. The uneven portion 620 includes a plurality of rectangular strips 622. The plurality of rectangular strips 622 may have different sizes. The plurality of rectangular strips 622 having different sizes may overlap each other.

Figure 6C:
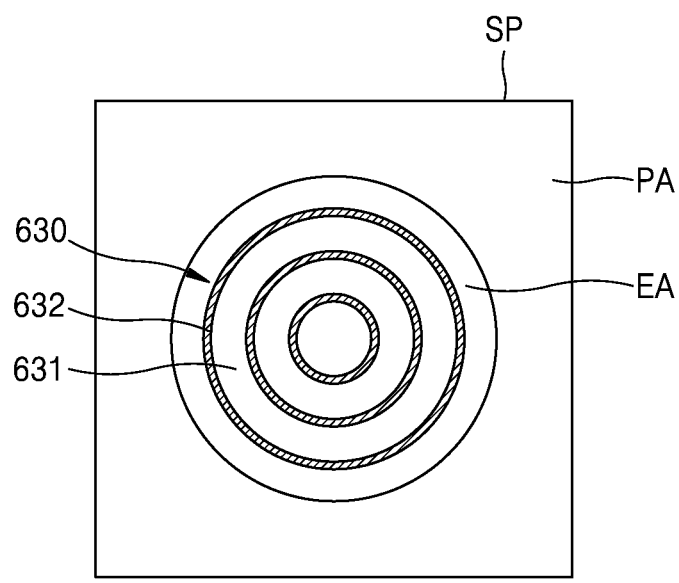

Referring to FIG. 6C, in the sub-pixel SP, a high refractive layer 631 may be arranged. In the light-emitting area EA, an uneven portion 630 may be arranged on the high refractive layer 631. The uneven portion 630 includes a plurality of rings 632. The plurality of rings 632 may have different sizes. The plurality of rings 632 having different sizes may overlap each other.

Figure 7:
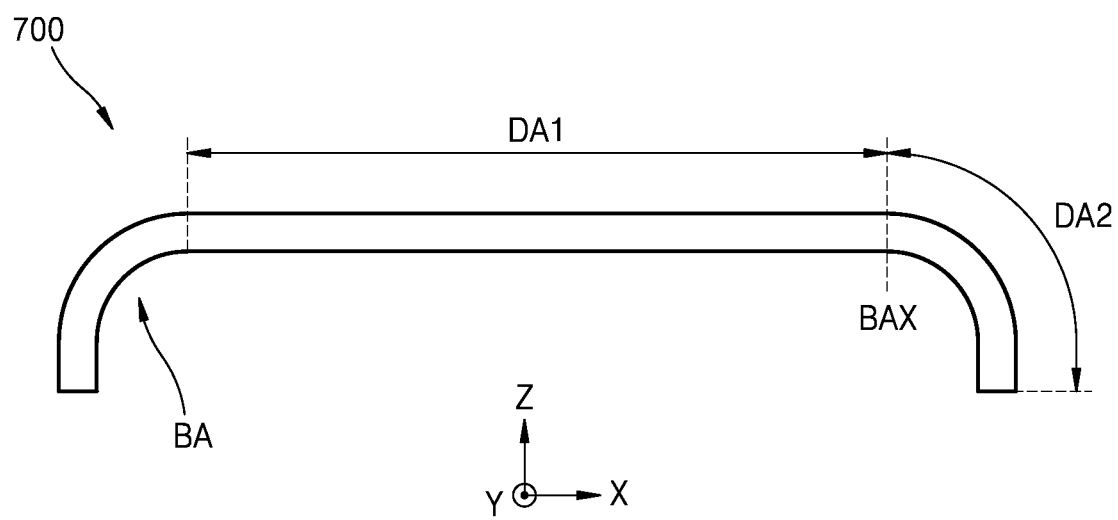
FIG. 7 is a cross-sectional view of a flexible display device according to another embodiment.

FIG. 7 is a cross-sectional view of a flexible display device 700 according to another embodiment.

Hereinafter, in all the embodiments, like reference numerals in the drawings denote like elements with same functions. Features in the respective embodiments are described.

Referring to the drawing, the flexible display device 700 includes a first display area DA1 extending in a first direction (an X-direction) and a second display area DA2 bent in a second direction (a Z-direction) crossing the first direction (the X-direction). The first direction (the X-direction) may cross the second direction (the Z-direction) in a perpendicular direction. The second display area DA2 includes a bent area BA bent in the second direction (the Z-direction) along a bending axis BAX.

The first display area DA1 and the second display area DA2 may display an image together or images separately from each other. The first display area DA1 may be an area that a user may view from the front, and the second display area DA2 may be an area that a user may view from a side.

Optical function layers having different structures may be arranged in the first display area DA1 and the second display area DA2, respectively. In detail, whereas the first display area DA1 corresponds to a front surface of the flexible display device 700 that the user may view, and thus, may include a refractive layer having a flat surface, and whereas the second display DA2 corresponds to a side surface of the flexible display device 700 that the user may view, and thus, may include a refractive layer having an uneven portion.

Figure 8:
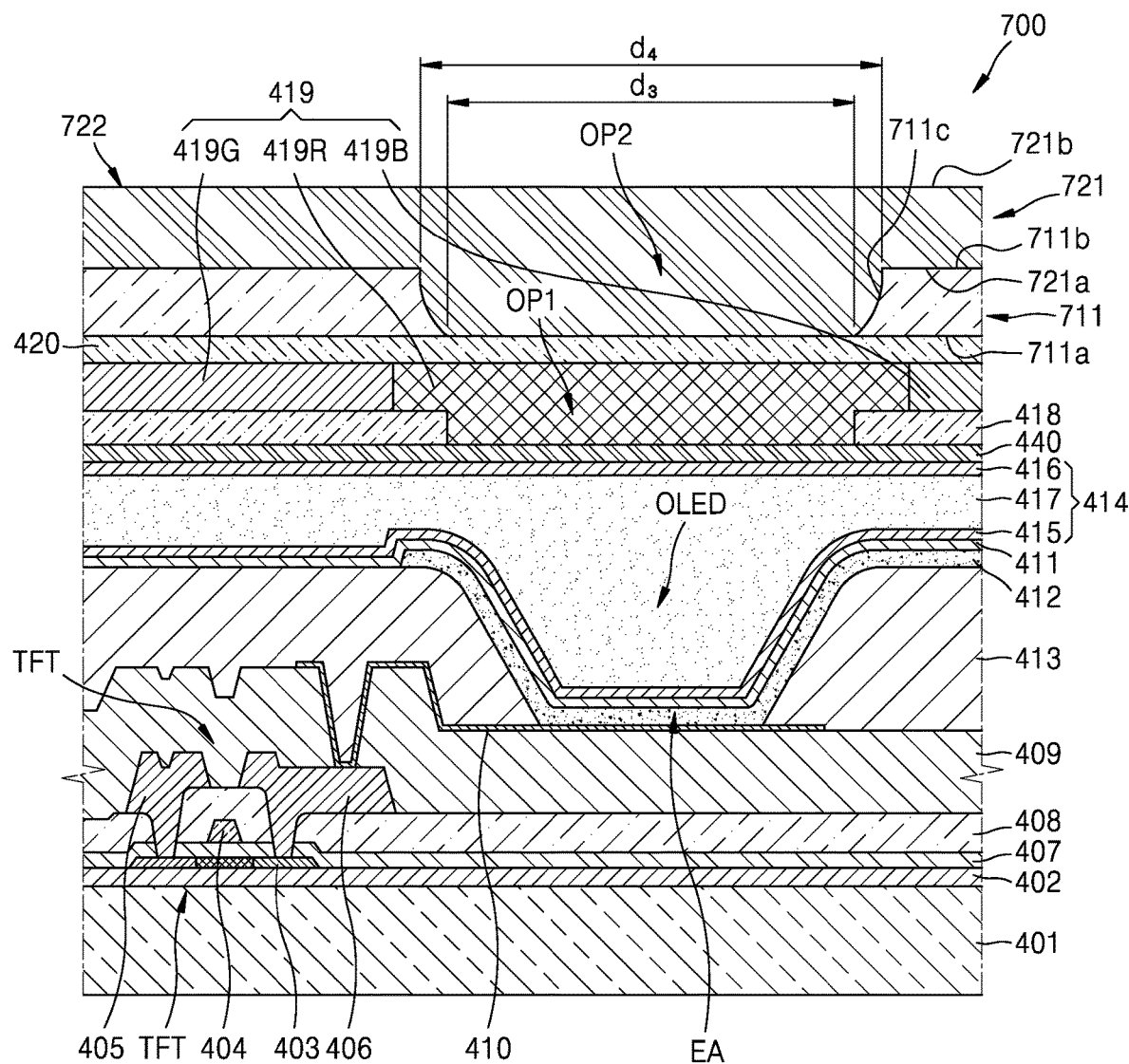
FIG. 8 is an expanded cross-sectional view of a sub-pixel of a first display area of FIG. 7.

FIG. 8 is an expanded cross-sectional view of a sub-pixel of the first display area DA1 of FIG. 7.

Referring to the drawing, the black matrix 418 may be arranged over the substrate 401. In the black matrix 418, the plurality of first openings OP1 may be arranged. The plurality of first openings OP1 may be respectively arranged in the light-emitting areas EA. The color filter layer 419 may be arranged in the light-emitting area EA defined by the black matrix 418. The color filter layer 419 may be arranged in the plurality of first openings OP1. On the color filter layer 419, the over-coating layer 420 may be arranged.

Over the over-coating layer 420, a low refractive layer 711 and a high refractive layer 721 having different refractive indices may be arranged. The low refractive layer 711 may be arranged on the over-coating layer 420 and the high refractive layer 721 may be arranged on the low refractive layer 711. The high refractive layer 721 may have a refractive index higher than that of the low refractive layer 711.

The low refractive layer 711 includes a first surface 711a facing the thin-film encapsulation layer 414 and a second surface 711b arranged in a position opposite to the thin-film encapsulation layer 414 with reference to the first surface 711a. The low refractive layer 711 includes the plurality of second openings OP2 corresponding to the light-emitting areas EA, respectively. A size $d_3$ of each of the plurality of second openings OP2 in the first surface 711a of the low refractive layer 711 may be different from a size $d_4$ of each of the plurality of second openings OP2 in the second surface 711b of the low refractive layer 711. In the plurality of second openings OP2, the first surface 711a may be connected to the second surface 711b by a slope 711c. The low refractive layer 711 includes an organic material having a refractive index of about 1.2 to about 1.3.

The high refractive layer 721 may cover the second surface 711b of the low refractive layer 711. In addition, the high refractive layer 721 may fill the plurality of second openings OP2. The high refractive layer 721 includes a first surface 721a facing the thin-film encapsulation layer 414 and a second surface 721b arranged in a position opposite to the thin-film encapsulation layer 414 with reference to the first surface 721a. The first surface 721a of the high refractive layer 721 may contact the second surface 711b of the low refractive layer 711. The second surface 721b of the high refractive layer 721 includes a flat surface. The high refractive layer 721 includes an organic material having a refractive index of about 1.5 or greater.

Since the low refractive layer 711 and the high refractive layer 721 are stacked in the respective light-emitting area EA, light lost from the inside of the panel due to refraction in a lens may be easily extracted. Accordingly, light efficiency on a front surface of the flexible display device 700 may be enhanced.

Figure 9:
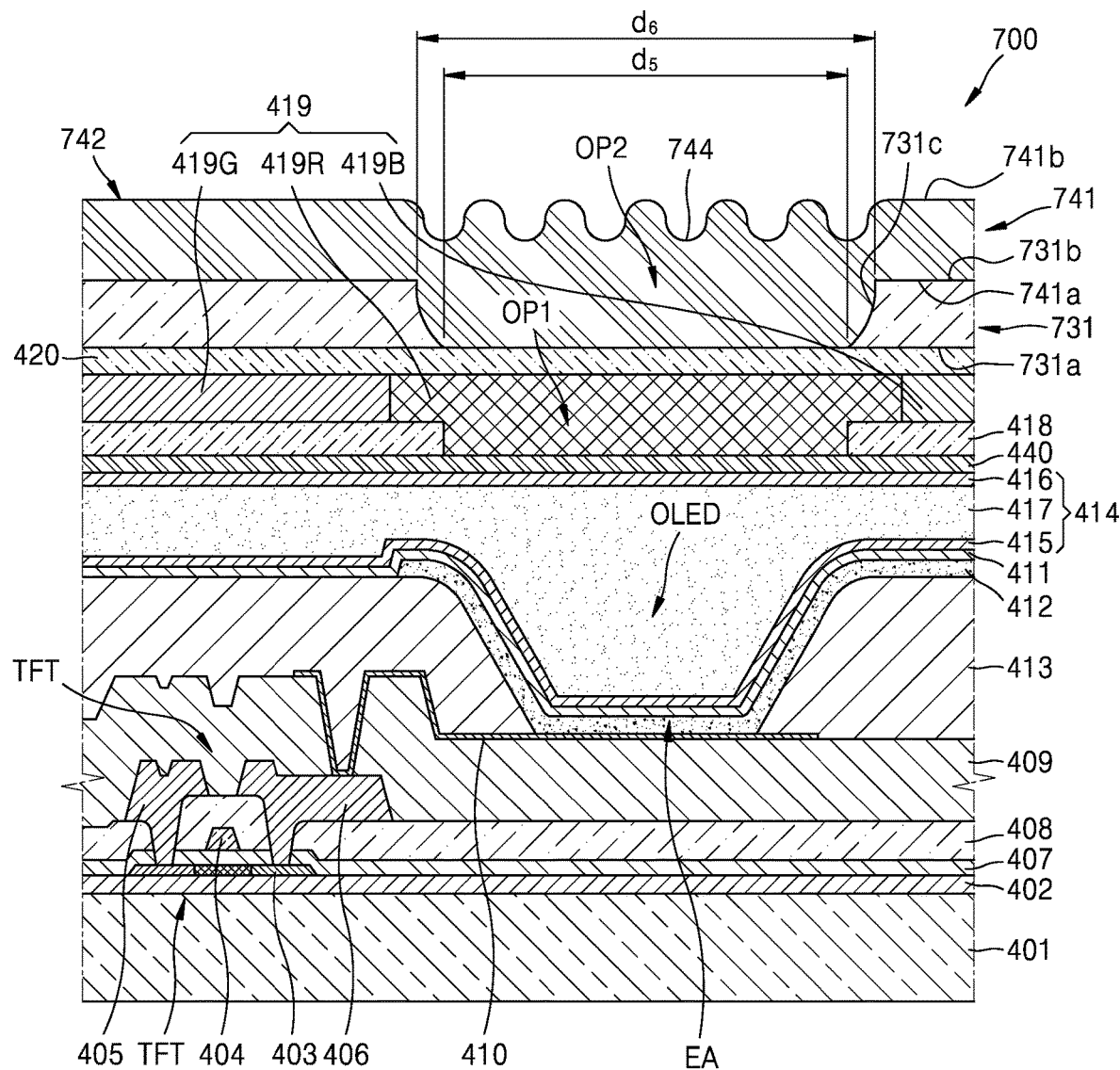
FIG. 9 is an expanded cross-sectional view of a sub-pixel of a second display area of FIG. 7.

FIG. 9 is an expanded cross-sectional view of a sub-pixel of the second display area DA2 of FIG. 7.

Referring to the drawing, over the substrate 401, the black matrix 418 may be arranged. In the black matrix 418, the plurality of first openings OP1 may be arranged. The plurality of first openings OP1 may be arranged in the light-emitting areas EA, respectively. The color filter layer 419 may be arranged in the light-emitting area EA defined by the black matrix 418. The color filter layer 419 may be arranged in the plurality of first openings OP1. On the color filter layer 419, the over-coating layer 420 may be arranged.

Over the over-coating layer 420, a low refractive layer 731 and a high refractive layer 741 having different refractive indices may be arranged. The low refractive layer 731 may be arranged on the over-coating layer 420 and the high refractive layer 741 may be arranged on the low refractive layer 731. The high refractive layer 741 may have a refractive index higher than that of the low refractive layer 731.

The low refractive layer 731 includes a first surface 731a facing the thin-film encapsulation layer 414 and a second surface 731b arranged in a position opposite to the thin-film encapsulation layer 414 with reference to the first surface 731a. The low refractive layer 731 includes the plurality of second openings OP2 corresponding to the light-emitting areas EA, respectively. A size $d_5$ of each of the plurality of second openings OP2 in the first surface 731a of the low refractive layer 731 may be different from a size $d_6$ of each of the plurality of second openings OP2 in the second surface 731b of the low refractive layer 731. In the plurality of second openings OP2, the first surface 731a may be connected to the second surface 731b by a slope 731c. The low refractive layer 731 includes an organic material having a refractive index of about 1.2 to about 1.3.

The high refractive layer 741 may cover the second surface 731b of the low refractive layer 731. In addition, the high refractive layer 741 may fill the plurality of second openings OP2. The high refractive layer 741 includes a first surface 741a facing the thin-film encapsulation layer 414 and a second surface 741b arranged in a position opposite to the thin-film encapsulation layer 414 with reference to the first surface 741a. The first surface 741a of the high refractive layer 741 may contact the second surface 731b of the low refractive layer 731. The high refractive layer 741 includes an organic material having a refractive index of about 1.5 or greater.

As described above, unlike the first display area DA1 of FIG. 8, the second display area DA2 of FIG. 9 may be a side surface of the flexible display device 700. Accordingly, characteristics of the WAD according to a viewing angle may be worsened. For example, when a white color lamp lights up, the first display area DA of FIG. 8, corresponding to a front surface of the flexible display device 700, displays a white color, but the second display area DA2 of FIG. 9, corresponding to a side surface of the flexible display device 700, may display a bluish color. To reduce the WAD, the high refractive layer 741 with an uneven portion 744 may be selectively applied to the second display area DA2 that is bent.

The uneven portion 744 may be arranged on the high refractive layer 741. The high refractive layer 741 includes a flat portion 742. The flat portion 742 may cover the second surface 731b of the low refractive layer 731 in a non-light-emitting area other than the respective light-emitting areas EA. The uneven portion 744 may be arranged in a portion of the high refractive layer 741 filling the plurality of second openings OP2 corresponding to the light-emitting areas EA, respectively. The uneven portion 744 may be arranged on the second surface 741b of the high refractive layer 741. The uneven portion 744 may be a protrusion in a hemispheric shape. While light emitted from the organic light-emitting diode OLED passes through the uneven portion 744, the light may generate diffused reflection. Resultantly, characteristics of the WAD may be reduced.

The flexible display device 700 may include a polarization layer instead of the black matrix 418 and the color filter layer 419 included in the embodiment described above.

Figure 10:
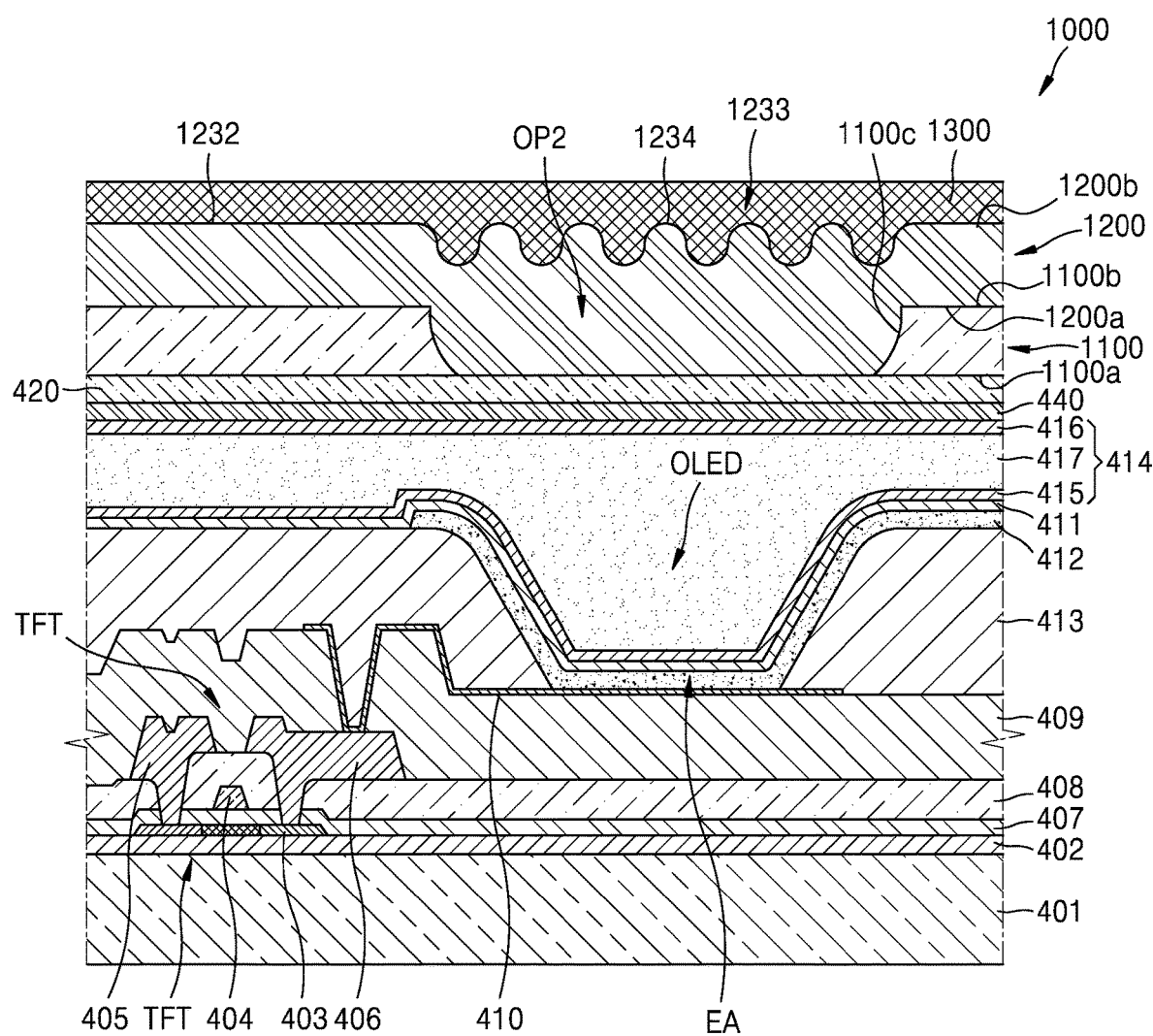
FIG. 10 is an expanded cross-sectional view of a sub-pixel of a flexible display device according to another embodiment.

FIG. 10 is an expanded cross-sectional view of a sub-pixel of a flexible display device 1000 according to another embodiment.

Referring to the drawing, over the substrate 401, the touch sensing unit 440 may be arranged. Unlike the embodiments described above, a block matrix and a color filter layer may not be arranged on the touch sensing unit 440. Accordingly, the plurality of first openings OP1 may not be included. On the touch sensing unit 440, the over-coating layer 420 may be arranged.

Over the over-coating layer 420, a low refractive layer 1100 and a high refractive layer 1200 having different refractive indices may be arranged. The low refractive layer 1100 may be arranged on the over-coating layer 420 and the high refractive layer 1200 may be arranged on the low refractive layer 1100. The high refractive layer 1200 may have a refractive index higher than that of the low refractive layer 1100.

The low refractive layer 1100 includes a first surface 1100a facing the thin-film encapsulation layer 414 and a second surface 1100b arranged in a position opposite to the thin-film encapsulation layer 414 with reference to the first surface 1100a. The low refractive layer 1100 includes the plurality of second openings OP2 corresponding to the light-emitting areas EA, respectively. In the plurality of second openings OP2, the first surface 1100a may be connected to the second surface 1100b by a slope 1100c. The low refractive layer 1100 includes an organic material having a refractive index of about 1.2 to about 1.3.

The high refractive layer 1200 may cover the second surface 1100b of the low refractive layer 1100. In addition, the high refractive layer 1200 may fill the plurality of second openings OP2. The high refractive layer 1200 includes a first surface 1200a facing the thin-film encapsulation layer 414 and a second surface 1200b arranged in a position opposite to the thin-film encapsulation layer 414 with reference to the first surface 1200a. The first surface 1200a of the high refractive layer 1200 may contact the second surface 1100b of the low refractive layer 1100. The high refractive layer 1200 includes an organic material having a refractive index of about 1.5 or greater.

To reduce the WAD, an uneven portion 1234 may be arranged on the high refractive layer 1200. The high refractive layer 1200 includes a flat portion 1232. The flat portion 1232 may cover the second surface 1100b of the low refractive layer 1100 in a non-light-emitting area other than the respective light-emitting areas EA. The uneven portion 1234 may be arranged in a portion 1233 of the high refractive layer 1200 filling the plurality of second openings OP2 corresponding to the light-emitting areas EA, respectively. The uneven portion 1234 may be arranged on the second surface 1200b of the high refractive layer 1200. The uneven portion 1234 may be a protrusion in a hemispheric shape. While light emitted from the organic light-emitting diode OLED passes through the uneven portion 1234, the light may generate diffused reflection. Accordingly, the WAD in the panel may be reduced.

On the high refractive layer 1200, a polarization layer 1300 may be arranged. The polarization layer 1300 may cover a second surface 1200b of the high refractive layer 1200 including the uneven portion 1234. The polarization layer 1300 may reduce reflection of external light. In an embodiment, in the flexible display device 1000, the polarization layer 1300 may be arranged on a flat surface of the high refractive layer 1200 other than the uneven portion 1234.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A flexible display device comprising:
a substrate on which a plurality of sub-pixels are arranged and which comprises a light-emitting diode having an emissive layer arranged in a light-emitting area of each of the plurality of sub-pixels;
a thin-film encapsulation layer covering the light-emitting diode;
a black matrix arranged in a peripheral area of the plurality of sub-pixels and comprising a plurality of first openings, each of the first openings disposed on the light-emitting area;
a color filter layer comprising a plurality of color filters in each of the plurality of first openings;
a low refractive layer arranged on the color filter layer; and
a high refractive layer arranged on the low refractive layer and having a refractive index higher than a refractive index of the low refractive layer.

2. The flexible display device of claim 1, wherein the low refractive layer comprises a plurality of second openings, each of second openings disposed on the light-emitting areas.

3. The flexible display device of claim 2, wherein the low refractive layer comprises a first surface facing the thin-film encapsulation layer and a second surface arranged in a position opposite to the thin-film encapsulation layer with reference to the first surface, and
a size of a second opening in the first surface is different from a size of a second opening in the second surface.

4. The flexible display device of claim 2, wherein the low refractive layer comprises an organic material having a refractive index of 1.2 to 1.3.

5. The flexible display device of claim 2, wherein the high refractive layer covers the low refractive layer and fills the plurality of second openings.

6. The flexible display device of claim 5, wherein the high refractive layer comprises a first surface facing the thin-film encapsulation layer and a second surface arranged in a position opposite to the thin-film encapsulation layer with reference to the first surface, and
the second surface comprises an uneven portion.

7. The flexible display device of claim 6, wherein the uneven portion is arranged to fill the second opening corresponding to each of the light-emitting areas.

8. The flexible display device of claim 7, wherein, in a plan view, the uneven portion comprises a shape selected from a dot type, a stripe type, a ring type, a rectangular type, a round type, an oval type, a wavy type, and a band type.

9. The flexible display device of claim 5, wherein the high refractive layer comprises a first surface facing the thin-film encapsulation layer and a second surface arranged in a position opposite to the thin-film encapsulation layer with reference to the first surface, and
the second surface comprises a flat surface.

10. The flexible display device of claim 5, wherein the high refractive layer comprises an organic material having a refractive index of 1.5 or greater.

11. The flexible display device of claim 1, wherein a touch sensing unit is further arranged on the thin-film encapsulation layer, and
the touch sensing unit comprises:
a plurality of first electrode patterns patterned on the thin-film encapsulation layer;
a plurality of second electrode patterns crossing the plurality of first electrode patterns; and
an insulating layer configured to insulate the plurality of first electrode patterns from the plurality of second electrode patterns.

12. A flexible display device comprising:
a substrate comprising a first display area in a first direction and a second display area bent in a second direction crossing the first direction;
a light-emitting diode comprising an emissive layer in a light-emitting area of each of sub-pixels of the first display area and the second display area;
a thin-film encapsulation layer covering the light-emitting diode;
a black matrix arranged in a peripheral area of the sub-pixels and comprising a plurality of first openings, each of the first openings disposed on the light-emitting areas;
a color filter layer comprising a plurality of color filters in each of the plurality of first openings;
a low refractive layer arranged on the color filter layer; and
a high refractive layer arranged on the low refractive layer and having a refractive index higher than a refractive index of the low refractive layer.

13. The flexible display device of claim 12, wherein the low refractive layer comprises a plurality of second openings, each of the second openings disposed on the light-emitting area.

14. The flexible display device of claim 13, wherein the high refractive layer covers the low refractive layer and fills the plurality of second openings.

15. The flexible display device of claim 14, wherein the high refractive layer in the first display area comprises a first surface facing the thin-film encapsulation layer and a second surface arranged in a position opposite to the thin-film encapsulation layer with reference to the first surface, and
the second surface has a flat surface.

16. The flexible display device of claim 14, wherein the high refractive layer in the second display area comprises a first surface facing the thin-film encapsulation layer and a second surface arranged in a position opposite to the thin-film encapsulation layer with reference to the first surface, and
the second surface has an uneven portion.

17. The flexible display device of claim 16, wherein the uneven portion is arranged to fill the second opening corresponding to each of the light-emitting.

18. A flexible display device comprising:
a substrate on which a plurality of sub-pixels are arranged and which comprises a light-emitting diode having an emissive layer arranged in a light-emitting area of each of the plurality of sub-pixels;
a thin-film encapsulation layer covering the light-emitting diode;
a low refractive layer arranged on the thin-film encapsulation layer and comprising a plurality of openings, each of the openings disposed on the light-emitting area;
a high refractive layer arranged on the low refractive layer and having a refractive index higher than a refractive index of the low refractive layer; and
a polarization layer arranged on the high refractive layer and covering the high refractive layer.

19. The flexible display device of claim 18, wherein the high refractive layer covers the low refractive layer and fills the plurality of openings.

20. The flexible display device of claim 19, wherein the high refractive layer comprises a first surface facing the thin-film encapsulation layer and a second surface arranged in a position opposite to the thin-film encapsulation layer with reference to the first surface, and the second surface comprises an uneven portion in the high refractive layer filling the plurality of openings, each of the openings disposed on the light-emitting area.

* * * * *